METHOD FOR FABRICATING THIN FILM TRANSISTORS

Filed May 8, 1964

INVENTOR.
Joseph H. McCusker
BY [signature]
Attorney 3,298,863
Patented Jan. 17, 1967

3,298,863
METHOD FOR FABRICATING THIN FILM TRANSISTORS

Joseph H. McCusker, Princeton, N.J., assignor, by mesne assignments, to the United States of America as represented by the Secretary of the Navy Filed May 8, 1964, Ser. No. 366,205
4 Claims. (Cl. 117—212)

Figure 1:
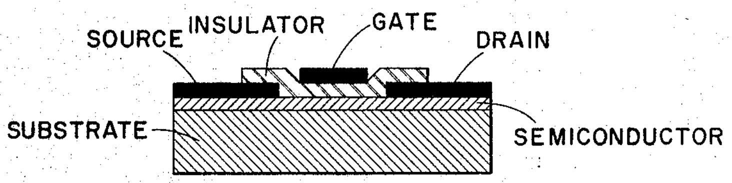

The present invention relates generally to semiconductor amplifying devices and, more particularly, to a method of fabricating thin film transistors.

The thin film transistor is a majority carrier semiconductor device which utilizes as the mechanism of amplification the enhancement of current in a narrow gap between electrodes when an electric field is applied transverse to the gap plane. It is constructed wholly by vacuum deposition of metals, insulators and semiconductors upon an insulating substrate.

In one type of thin film transistor construction, two electrodes, one called the "source" and the other the "drain," which are separated by a gap of several microns, are first deposited upon a smooth, insulating substrate. A polycrystalline, cadmium sulfide film is then evaporated over the gap region. Next, an insulating material, such as silicon monoxide, is evaporated over the cadmium sulfide, and then a control electrode which covers the gap is deposited over this insulating material. Since the thin film transistor is a majority carrier device, the source and drain contacts must be ohmic. The first contact material used was gold, but this metal proved too unreliable. Although aluminum proved satisfactory, it had a tendency to oxidize on contact with air and, consequently, it was necessary to deposit this material onto the cadmium sulfide, the reverse of the procedure mentioned above. This change results in a thin film structure in which all the electrodes are coplanar. In this configuration the polycrystalline film of cadmium sulfide is first deposited upon the substrate, then the "source" and "drain" electrodes are evaporated over the cadmium sulfide, and thereafter the insulating material and the "gate" electrode, in this order, are sequentially deposited over the gap region.

If a voltage is applied across the "source" and "drain" electrodes, a small current flows therebetween, the magnitude of which is determined by the gap length and width, the thickness of the cadmium sulfide film and the resistivity of this film. If a positive voltage is now applied to the "gate," a thin layer of electrons accumulates at the cadmium sulfide insulator interface, creating a thin conducting channel which produces an increase in the "source-drain" current. If this "gate" voltage is increased and made to approach the "drain" voltage or if the "gate" voltage is held fixed and the "drain" voltage increased, the current saturates, giving the device a pentode-like, current-voltage characteristic. Since the "gate" electrode is insulated from the semiconductor body, the transistor possesses a high input resistance. Its input capacitance, which is a function of its geometry and, to some extent, the "gate" voltage, is typically in the tens of picofarads range.

The electronic characteristics and method of fabrication of the thin film transistor suggest that this semiconductor amplifying device will have widespread application as an active element in integrated electronic circuits. However, it has been found that immediately after its fabrication it exhibits slowly changing electronic properties. Generally, there is an initial improvement manifested by an increase in transconductance followed by a larger decrease in transconductance which occurs in a day or two. The "decay rate" slowly decreases, reaching some small limiting value in any time from three weeks to a month. The saturation of the current with "drain" voltage is generally not affected, and the zero biased "drain" current decreases. The "final transconductance," however, deteriorates to a value between 30% and 50% of its initial value. Although exposure to the atmosphere accelerates this decay, vacuum encapsulation does not prevent it.

It is accordingly a primary object of the present invention to provide a new method of fabricating coplanar thin film transistors.

Another object of the present invention is to provide a new method for producing thin film transistors which stabilizes their electrical characteristics.

A still further object of the present invention is to provide a method for fabricating thrin film transistors which includes an ion bombardment treatment of the semiconductor film area that is covered by the "source" and "drain" electrodes.

A yet still further object of the present invention is to provide a thin film transistor fabrication procedure which subjects a selected portion of the semiconductor film to a glow discharge in order to prevent deterioration of the transistor's transconductance.

Figure 2:
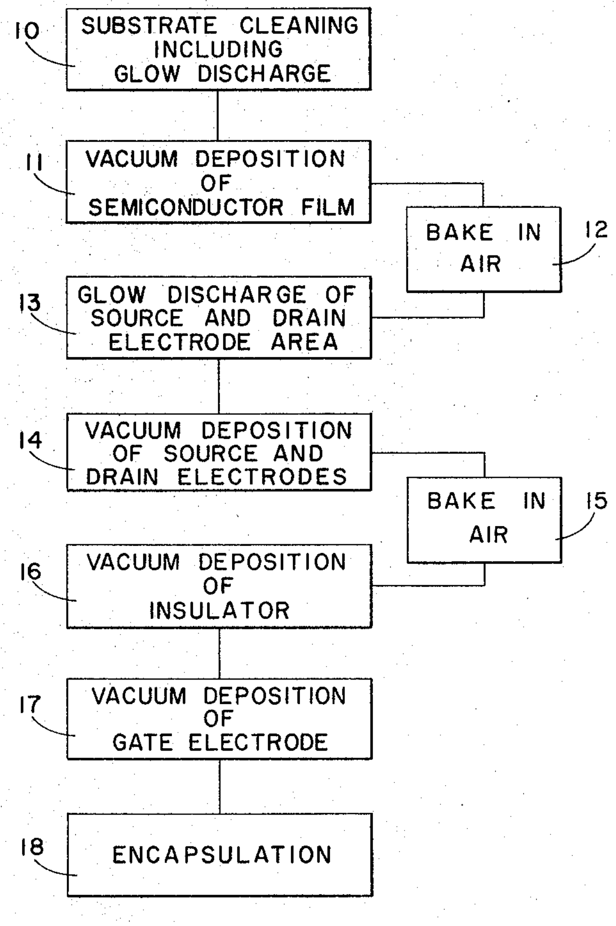

Other objects, advantages and novel features of the invention will become apparent from the following detailed description of the invention when considered in conjunction with the accompanying drawings wherein:

FIG. 1 depicts a thin film transistor fabricated in accordance with the present invention; and FIG. 2 illustrates the successive operations involved in fabricating a transistor such as the type shown in FIG. 1.

As mentioned hereinbefore, previously fabricated thin film transistors exhibited a gradual decay of properties, the nature of which was such that the "drain" current for the highest applied "gate" voltage decreased, "crowding" together the family of "source-drain" characteristics, with attendant decline of transconductance. It was observed that occasionally the aluminum contact characteristic did not appear ohmic but resembled that of high reverse leakage current diodes connected back to back. It was, therefore, postulated that the decay mechanism was related to contact failure, that is, to a transition from ohmic to blocking contacts. For example, when such contacts were placed near a spark coil discharge, they became more nearly ohmic, indicating a breakdown of a barrier layer between the electrode and the semiconductor.

When a high voltage spark coil was applied to the contact electrodes of units which exhibited poor transconductance and crowded characteristics, there was complete restoration of these transistors with no subsequent deterioration. However, the spark coil discharge treatment is not acceptable since it does not prevent the initial decline in the transistors' performance and can just as readily break down the thin film insulator as bring about the improvement sought.

In the present invention the solution involves glow-discharging the cadmium sulfide surface prior to the aluminum contact deposition. This produces ohmic contacts which do not deteriorate. The exact physical process is not known, but it is suspected that a preferential etching of sulphur or a reduction of cadmium sulfide takes place, leaving excess cadmium on the surface.

Because of the possible utilization of thin film transistors in digital circuits utilizing the "on" and "off" states of the device to represent the binary digits, it is desirable that the transistor draw negligible current when it is in an "off" state. This condition minimizes power consumption and maximizes the voltage swing produced when the device is switched between states. For these reasons, the thin film transistor should possess a low zero-bias current. Since this zero-bias current is related to the channel or gap resistivity and since the glow discharge treatment lowers this resistance, the channel area should be shielded during the glow discharge treatment by, for example, a narrow insulating and protecting strip.

Referring now to the drawings, FIG. 1, it will be seen, illustrates the coplanar thin film transistor construction alluded to hereinbefore where the "source," "drain" and "gate" electrodes are on the same side of the semiconductor film.

FIG. 2 shows the sequence of steps utilized in the present invention to fabricate the transistor of FIG. 1 and insure the stability of its electrical characteristics. In the first step, 10, of the process, the substrate, which may be, for example, optically polished, fused quartz, is subjected to a cleaning operation which involves ultrasonically cleaning the material in a detergent, such as Alconox, rinsing in distilled water, vapor-degreasing in isopropyl alcohol, and flame drying. After this, the substrate is placed in the vacuum system while still warm and exposed to a D.C. glow discharge. This first glow discharge, which is carried on during pumpdown, improves the uniformity and reproducibility of the transistor and acts as a final ion bombardment cleaning which increases the accommodation coefficient of the substrate surface.

In carrying out this glow discharge, an aluminum ring may be used as one of the electrodes, while the evaporation mask subsequently used to define the contact area may be employed as the other electrode. In one case, the quartz substrate with its evaporation mask in place was mounted parallel to and about two inches away from the ring. Another piece of aluminum was inserted between the ring and the substrate to prevent direct electron bombardment while permitting ion bombardment of the quartz substrate in the regions over which the cadmium sulfide was to be deposited. The D.C. glow discharge was at 40 milliamperes at 500 volts and bombardment took place during the pumpdown from 1,000 to 100 microns with air and helium present.

After the substrate has been treated in the above manner and as the second step in the process, 11, the cadmium sulfide semiconductor layer is evaporated thereon. In one case, cadmium sulfide pressed powder pellets were placed in a boat which took the form of a fused quartz funnel with the narrow end sealed. The charge was placed in the sealed end and heated to about 180° C. by a tantalum helix which surrounded the cylindrical portion of the funnel. The conical walls of the funnel were also heated to about 350° C. by a nichrome heater. A shutter mechanism was interposed between the boat and the substrate holder and maintained closed during the pumpdown operation. This shutter was closed during outgassing and during the first few minutes of evaporation so as to allow some "gettering" and the establishment of equilibrium pressure within the apparatus. The shutter was then opened and the cadmium sulfide deposition allowed to take place until a film of 700 A. to 1,000 A. was deposited as monitored by reflection interferometry using red light. The deposition rate was 20 A. to 25 A. per second.

After the deposition of the cadmium sulfide and as the third step in the process, 12, the material is air-baked at approximately 500° C. This air-bake increases mobility, reduces the excess cadmium concentration and increases the resistance of the material by forming an oxygen layer on the surface.

The next step, 13, as mentioned hereinbefore, involves subjecting the cadmium sulfide film to a glow discharge just prior to the deposition of the "source" and "drain" electrodes. This discharge is employed to obtain ohmic contacts by ion bombardment of those areas of the cadmium sulfide over which these electrodes are to be deposited. The glow discharge removes the aforementioned oxygen layer, and highly conducting cadmium sulfide is then obtained. The "source" and "drain" electrodes, as will be seen hereinafter, can then be thrown onto the highly conducting electrode regions. Here, again, the quartz substrate, with the cadmium sulfide deposited thereon and the electrode mask in place, were placed parallel to an aluminum ring. This ring served as one electrode, and the evaporation mask, which was placed at ground potential, served as the other electrode. In one case, the ion bombardment lasted for approximately thirty minutes at 300 microns in nitrogen pressure, and the resistivity of the bombarded cadmium sulfide surface was reduced to one ohm per centimeter. Other gases, such as helium, air, oxygen and hydrogen, have been used with similar results.

In order to prevent the channel resistance from being lowered, a condition which increases the zero bias current, a 0.4 mil wire was mounted on the evaporation mask to shield this region from the glow discharge.

The next step, 14, consists of evaporating the "source" and "drain" electrodes on the treated cadmium sulfide film. The source material in one case was an aluminum rod, and the boat was an alumina-coated molybdenum wire wound cone. The source to substrate distance was eight inches and the thickness of these electrodes was 300 A. This thickness was monitored by observing the change in the resonant frequency of a quartz crystal located near the substrate as the deposition increased its mass. In one case, the mask was used to throw first one electrode on the cadmium sulfide and then the other with its appropriate spacing.

As the next step in the process, 15, the device is post-baked. In one case this baking was for about fifteen to thirty minutes at between 200° and 300° C. in air. It would be pointed out that if the 0.4 mil wire properly shielded the channel region, this bake would not be necessary. However, this second bake has usually been required to restore the oxygen layer in the channel region. In one case this bake changed the resistance from hundreds of ohms to megohms and did not tend to oxidize the aluminum "source" and "drain" contacts.

The next step, 16, in the process is the deposition of the insulator. The material used was silicon monoxide, and small granules of this substance were placed in a tantalum boat. The thickness of the insulator was 500 A.

The last step, 17, consists of the deposition of the "gate" electrode. The conditions accompanying the deposition of this electrode were identical to those attending the deposition of the "source" and "drain" electrodes. A separate vacuum cycle, of course, was used for each deposition.

Instead of using silicon monoxide as the insulating material, calcium fluoride and silicon dioxide have also been employed. As mentioned before, aluminum was used as the "source," "drain" and "gate" electrode material. Also, both A.C. and D.C. glow discharges have been used with substantially the same result. As an optional additional step, 18, in the process, the transistor may be encapsulated by any conventional procedure.

Obviously many modifications and variations of the present invention are possible in the light of the above teachings. It is therefore to be understood that within the scope of the appended claims the invention may be practiced otherwise than as specifically described.

What is claimed is:

1. In a method for fabricating thin film transistors, the steps of depositing a thin film of a semi-conductive material on an insulating substrate;

baking the unit in air at a temperature of about 500° C.;

subjecting said thin film of semi-conductor material to a glow discharging in proximity thereto;

depositing spaced metallic contacts on said semi-conductor thin film;

rebaking said unit in air at a temperature of about 200–300° C.;

depositing an insulating material on the space between said metallic contacts;

and depositing a metallic electrode over a portion of said insulating material at a location between said spaced metallic contacts.

2. In a method for fabricating a thin film insulated gate field effect device, the steps of vacuum depositing on an insulating substrate a thin film of a semi-conductor material;

subjecting a pair of spaced areas of said thin film to an ion bombardment;

vacuum depositing metallic contacts over said spaced areas, thereby to form a "source" and "drain" electrode;

vacuum depositing an electrically insulating material over the space separating said metallic contacts and allowing a portion of said insulating material to overlay a pair of confronting edge portions of said electrodes;

and vacuum depositing a metallic contact over a portion of said last-mentioned insulating material thereby to form a "gate" electrode at a location which is midway between said "source" and "drain" electrodes.

3. In a method for fabricating a thin film insulated gate field effect device, the steps of vacuum depositing a thin film of cadmium sulfide on an insulating substrate;

baking said unit in air to increase the resistance of said thin film of cadmium sulfide by forming an oxygen layer on its surface;

subjecting a pair of spaced areas of said thin film of cadmium sulfide to an ion bombardment thereby to remove said oxygen layer from these areas while permitting said oxygen layer to remain on said film in the space between said areas;

vacuum depositing aluminum contacts over said spaced areas to form "source" and "drain" electrodes;

vacuum depositing silicon monoxide on the space between said aluminum contacts, a portion of this silicon monoxide being permitted to overlay confronting edge portions of said "source" and "drain" electrodes;

and vacuum depositing an aluminum contact over a portion of said silicon monoxide at a location between said "source" and "drain" electrodes to form a "gate" electrode.

4. In a method as defined in claim 3, the additional step of baking said unit in air after said "source" and "drain" electrodes are formed to restore the oxygen layer in the region between said electrodes which may have to be removed during the formation of these electrodes.

References Cited by the Examiner

UNITED STATES PATENTS

| | | | |
|---|---|---|---|
| 2,524,034 | 10/1950 | Brattain | 317—234 |
| 2,989,385 | 6/1961 | Gianola. | |
| 3,080,481 | 3/1963 | Robinson. | |
| 3,102,230 | 8/1963 | Kahng | 317—234 |
| 3,135,926 | 6/1964 | Bockemuehl | 317—234 |
| 3,191,061 | 6/1965 | Weimer | 317—234 |

JOHN F. CAMPBELL, *Primary Examiner.*

WILLIAM I. BROOKS, *Examiner.*